United States Patent
Han et al.

(12) 
(10) Patent No.: US 6,847,566 B1
(45) Date of Patent: Jan. 25, 2005

(54) METHOD AND CIRCUIT CONFIGURATION FOR MULTIPLE CHARGE RECYCLING DURING REFRESH OPERATIONS IN A DRAM DEVICE

(75) Inventors: Jonghee Han, Cary, NC (US); Jung Pill Kim, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/692,119

(22) Filed: Oct. 23, 2003

(51) Int. Cl.[7] .............................................. G11C 7/00
(52) U.S. Cl. .................. 365/203; 365/222; 365/205
(58) Field of Search ................................ 365/203, 222, 365/205

(56) References Cited

U.S. PATENT DOCUMENTS 6,094,389 A * 7/2000 Ahn ........................... 365/222
6,310,814 B1 * 10/2001 Hampel et al. ............. 365/203
6,563,757 B2 * 5/2003 Agata ......................... 365/222

* cited by examiner

*Primary Examiner*—Huan Hoang
(74) *Attorney, Agent, or Firm*—Moser, Patterson & Sheridan, L.L.P.

(57) ABSTRACT

Methods and circuit configurations for multiple recycling of charge during a refresh operation in a memory device, such as a dynamic random access memory (DRAM) device, are provided. Charge from one or more power lines of a first array of bit line sense amplifiers involved in a first refresh operation may be transferred to one or more power lines of at least second and third arrays of bit line sense amplifiers involved in subsequent refresh operations.

23 Claims, 10 Drawing Sheets

US 6,847,566 B1

METHOD AND CIRCUIT CONFIGURATION FOR MULTIPLE CHARGE RECYCLING DURING REFRESH OPERATIONS IN A DRAM DEVICE

BACKGROUND OF THE INVENTION

1. Field of the Invention

The present invention generally relates to integrated circuit memory devices and, more particularly, to memory devices that require refresh operations to maintain data, such as dynamic random access memory (DRAM) devices.

2. Description of the Related Art

The evolution of sub-micron CMOS technology has resulted in an increasing demand for dynamic random access memory (DRAM) devices. A DRAM device is generally a volatile memory device where each memory cell consists of one transistor and one capacitor. Such memory cells require periodic refreshing to protect the data stored in a memory cell from corruption or decaying over time. Refreshing the memory cells is a power-consuming operation. In battery-powered computer systems (e.g., palm-top computers, hand-held electronic devices, and the like), minimization of power consumption is critically important in prolonging battery life.

In advanced DRAM devices, during a refresh operation, power consumption may be reduced by recycling a portion of bit line charges of bit line sense amplifiers (BLSAs) involved in a refresh operation in a subsequent refresh operation. As used herein, the term recycling generally refers to transferring (or sharing) bit line charges from one array of BLSAs involved in a refresh operation to another array of BLSAs to be involved in a subsequent refresh operation. However, according to conventional recycling techniques, the remaining portions of bit line charges are not utilized, as described below in reference to FIGS. 1–4.

FIG. 1 depicts a block diagram of a DRAM device 100. The DRAM device 100 generally comprises a system controller 102, a memory 104, an address bus 120, a command (i.e., system) bus 122, and a data bus 116. The system controller 102 may be further coupled to a processor 124 of an external electronic device (e.g., portable computer, cell phone, and the like) using, for example, an application-specific interface 112.

The memory 104 generally includes one or more component memories $104_K$ and a block 118 of data input/output buffers and multiplexers. Component memories and their functional devices are identified herein using the same reference numerals, except that the suffix "K", where K is an integer from 1 to N, has been added to differentiate between the individual memories and devices. Illustratively, a component memory $104_K$ comprises an address decoder $106_K$, a memory bank $108_K$, a sense amplifier array $110_K$, a refresh controller $112_K$, and a bank controller $114_K$.

FIG. 2 depicts a portion of a circuit configuration of the component memory $104_K$. The memory bank $108_K$ generally comprises at least one plurality of arrays of memory cells 200 and at least one a plurality of paired bit lines $202_B$ and complimentary bit lines $204_B$, where B is an integer from 1 to M. The memory cells 200 are selectively coupled to the lines $202_B$ and $204_B$. In the sense amplifier array $110_K$, the lines $202_B$ and $204_B$ are cross-coupled to respective bit line sense amplifiers (BLSA) $206_B$. Each BLSA $206_B$ comprises power nodes $214_S$ and $216_S$ that are selectively coupled to a pre-charge circuit $224_K$ of the refresh controller $112_K$ using corresponding power lines of a pre-charging bus $218_K$ and switches $212_B$. To transfer a charge from one BLSA (e.g., BLSA $206_B$) to another BLSA (e.g., BLSA $206_{B+1}$), the BLSA $206_B$ and BLSA $206_{B+1}$ are selectively interconnected using switches 210 (e.g., switches $210_{1-M}$). The switches 210 and 212 are selectively controlled by the sensing controller $222_K$ of the refresh controller $112_K$ using corresponding control lines 211 and 213 of a control bus $208_K$.

FIG. 3 depicts a block diagram of an exemplary circuit configuration 300 for use in recycling. In FIG. 3, for a purpose of graphical clarity, components of the pre-charge circuits (i.e., switches $212_B$, control lines $213_B$, and corresponding power lines between the BLSA $206_B$ and pre-charging bus $218_K$) are not shown. Conventionally, during the refresh operation in the component memory $104_K$, pre-selected pluralities (i.e., arrays) of the BLSAs $206_B$, memory arrays $220_B$, and switches $210_S$ are operated at the same time (i.e., synchronically).

Operation of components of the circuit configuration 300 may best be described with reference to FIG. 4, which depicts a flow chart of exemplary operations 400 for refreshing memory arrays 220, utilizing conventional recycling techniques. In other words, to best understand the operations 400, the reader should simultaneously refer to FIGS. 3 and 4.

The operations 400 begin at step 402 and proceed to performing an array refresh operation 404, including steps 406–412. At step 406, the refresh controller $112_K$ via the pre-charging bus $218_K$ activates the BLSA array $206_B$. During step 406, the pre-charge circuit $224_K$ selectively applies a pre-charge voltage to the power nodes $214_B$ and $216_B$ of the BLSA array $206_B$ using the power lines of the pre-charging bus 218 and switches $212_B$. At step 408, memory cells 200 of the array $220_B$ are refreshed using a conventional routine. Such a routine generally comprises sensing a content of a memory cell and charging a cell capacitor to the full respective logic level (i.e., a full logic high or logic low) using the BLSA array $206_B$.

At step 410, charge is transferred (e.g., recycled) from the BLSA array $220_B$ to the array $220_{B+1}$. For example, the sensing 222 may momentarily close the switches $210_1$ to transfer a portion of the charge from the BLSA array $206_M$ to the BLSA array $206_2$. Similarly, switch $210_S$ may be closed to recycle charge from the BLSA array $206_{M-1}$ to the BLSA array $206_M$. At step 412, having already recycled charge from the BLSA array $206_B$, power lines of the BLSA array $206_B$ are equalized. If all arrays $220_B$ of the memory $104_K$ have been not been refreshed (as determined at step 414), the next array to be refreshed array $220_{B+1}$ is selected (step 416) and the cycle 404 is performed for the arrays $220_{B+1}$. Such cycles 404 continue until all memory arrays of the memory device are refreshed.

In preparation of sensing operations, BLSA arrays are typically precharged to a level about half the voltage of a bit line high (VBLH). Due to charge sharing during recycling, power lines of the recipient array (e.g, BLSA array $206_{B+1}$) are additionally charged to a level about halfway between this pre-charge level and the final value of the source array (e.g. BLSA array $206_B$). As such, the charge required to bring the power lines of the BLSA array $206_{B+1}$ (from the precharge level) to a full level for sensing may be reduced by approximately 50%, which represents a substantial power savings.

However, during equalization (at step 412), the remaining charge of the BLSA array $206_B$, is lost without any useful utilization. Power losses caused by low efficiency of such one-time recycling of charge during refresh operations may substantially limit the amount of power savings achievable by recycling, thus shortening operational interval of battery-powered systems that use DRAM devices, as well as degrade the thermal budget of these memory devices.

Accordingly, there is a need in the art for an improved method and circuit configuration for multiple recycling of bit line charges.

SUMMARY OF THE INVENTION

Embodiments of the present invention provide methods and circuit configurations for multiple recycling of bit line charges.

One embodiment provides a method for recycling a charge in a dynamic random access memory (DRAM) device. The method generally includes performing a first refresh operation involving a first array of bit line sense amplifiers, transferring charge from power lines of the first array of bit line sense amplifiers to power lines of a second array of bit line sense amplifiers involved in a second refresh operation performed subsequent to the first refresh operation, and transferring charge from power lines of the first array of bit line sense amplifiers to power lines of a third array of bit line sense amplifiers involved in a third refresh operation performed subsequent to the second refresh operation.

Another embodiment provides a method of recycling charge for use in a refresh operation involving an $i^{th}$ array of bit line sense amplifiers of a dynamic random access memory (DRAM) device, where i is an integer. The method generally includes precharging power lines of the $i^{th}$ array of bit line sense amplifiers, sequentially transferring charge from one or more power lines of N arrays of bit line sense amplifiers involved in previous refresh operations to one or more power lines of the $i^{th}$ array, wherein N is an integer greater than 1 and the N arrays range from an $(i-N)^{th}$ array to an $(i-1)^{th}$ array, and subsequently coupling the one or more power lines of the ith array to one or more voltage supply lines.

Another embodiment provides a circuit configuration for multiple recycling of bit line charges. The circuit configuration generally includes one or more common recycle lines, a plurality of switches, each selectively coupling one or more power lines of a plurality of bit line sense amplifier arrays to the one or more common recycle lines, and a controller. The controller is generally configured to generate a plurality of recycle control signals to control the plurality of switches to sequentially (i) transfer charge from one or more power lines of a first array of bit line sense amplifiers previously involved in a first refresh operation to one or more power lines of a second array of bit line sense amplifiers involved in a second refresh operation performed subsequent to the first refresh operation and (ii) transfer charge from power lines of the first array of bit line sense amplifiers to power lines of a third array of bit line sense amplifiers involved in a third refresh operation performed subsequent to the second refresh operation Another embodiment provides a dynamic random access memory device generally including a plurality of memory cell arrays, each having at least one corresponding array bit line sense amplifiers, coupling means for selectively coupling one or more power lines of the arrays of bit line sense amplifiers, and recycle control circuitry. The recycle control circuitry is generally configured to, via the coupling means, (i) transfer charge from power lines of a first array of bit line sense amplifiers previously involved in a first refresh opera-tion to power lines of a second array of bit line sense amplifiers involved in a second refresh operation performed subsequent to the first refresh operation and (ii) transfer charge from power lines of the first array of bit line sense amplifiers to power lines of at least a third array of bit line sense amplifiers involved in at least a third refresh operation performed subsequent to the second refresh operation.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention provide methods and circuit configurations for multiple recycling of charge during a refresh operation in a dynamic random access memory (DRAM) device. Utilizing the techniques for multiple charge recycling described herein may result in more efficient charge recycling and reduced power consumption.

An Exemplary Circuit for Multiple Charge Recycling

Figure 1:
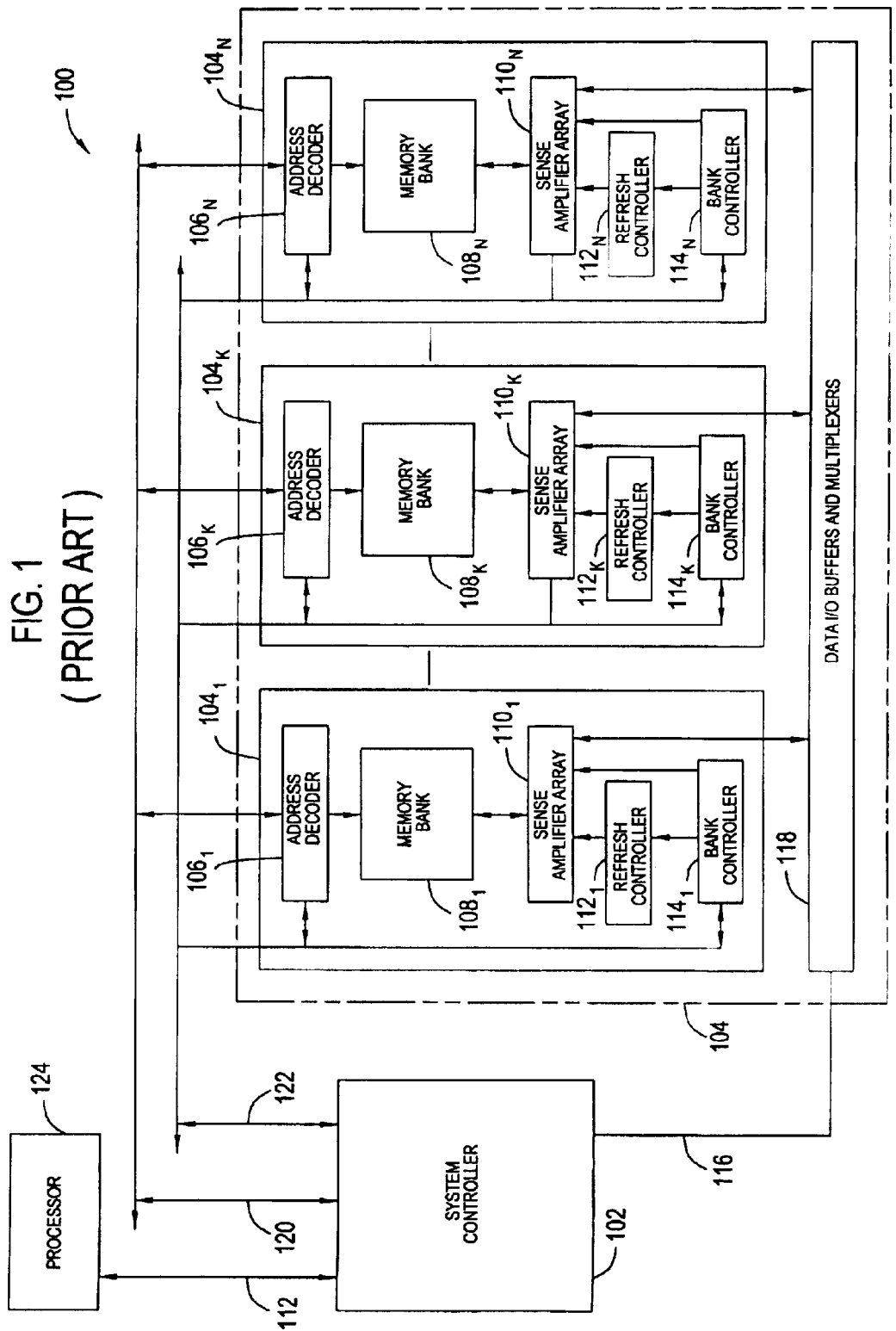
FIG. 1 depicts a block diagram of an exemplary DRAM device in which embodiments of the present invention may be utilized.
Figure 2:
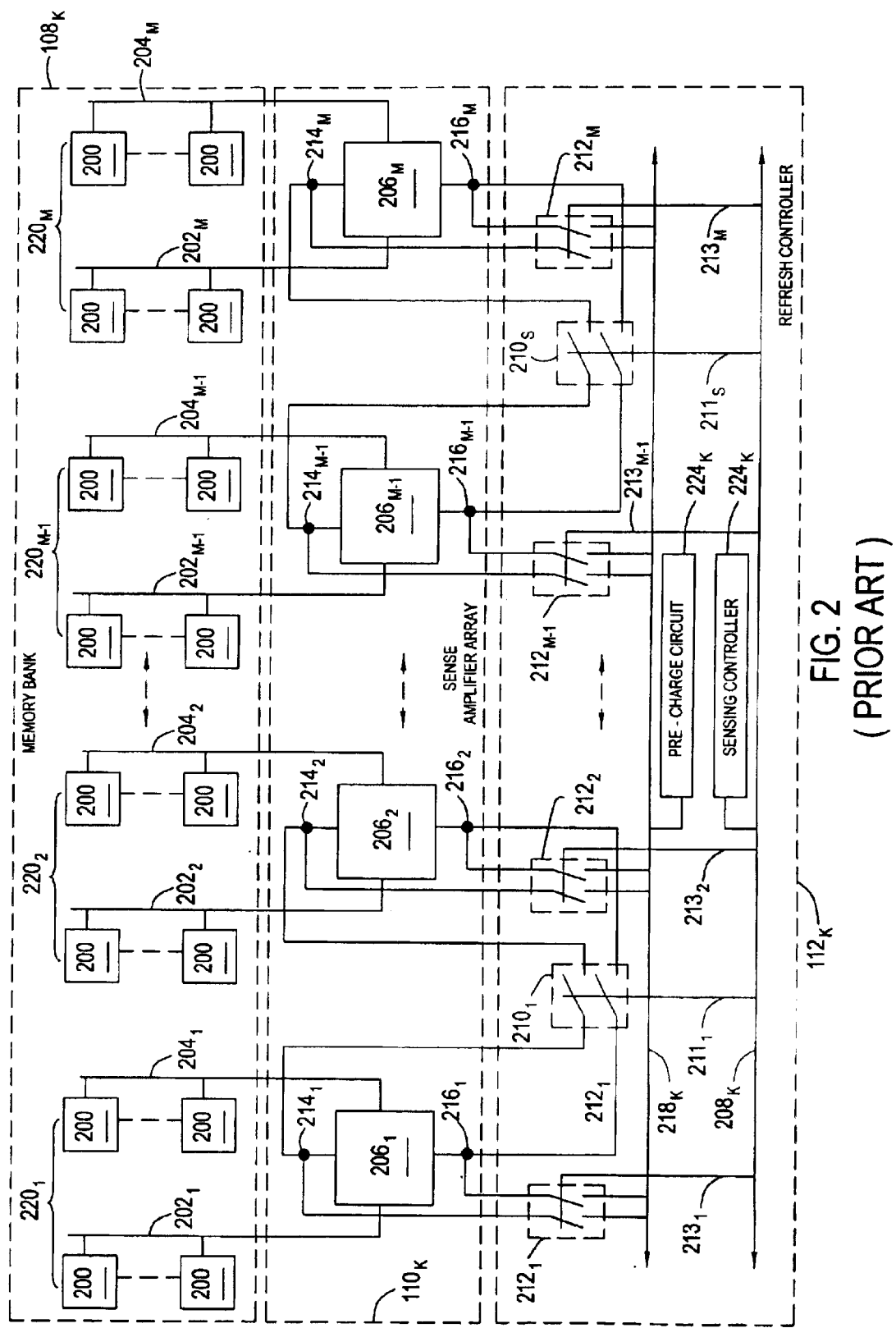
FIG. 2 depicts an exemplary circuit configuration for conventional one-time recycling a charge during a refresh operation in the DRAM device of FIG. 1.
Figure 3:
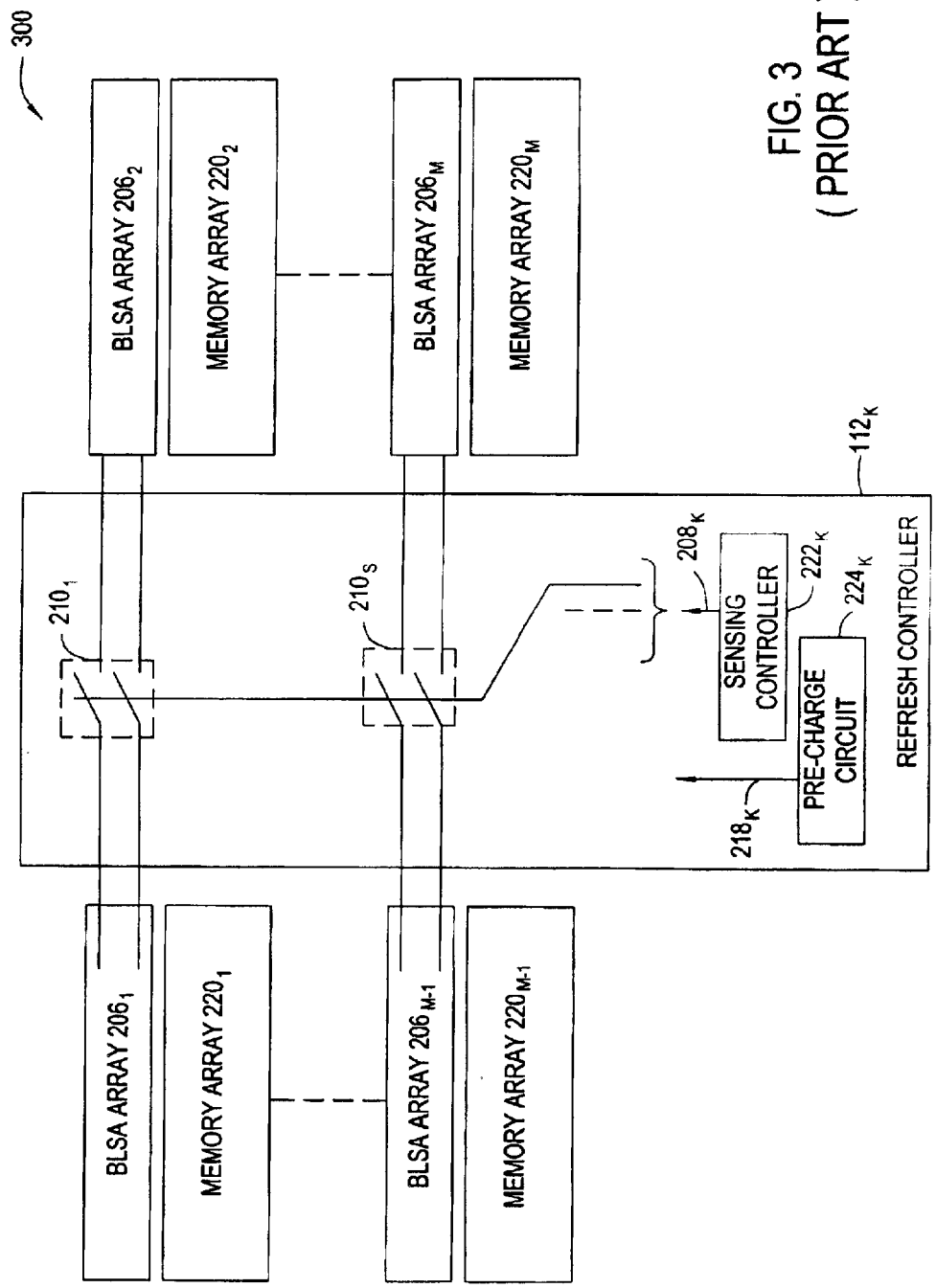
FIG. 3 depicts a simplified block diagram of a portion of the DRAM device of FIG. 1 that is configured for one-time recycling a charge during a refresh operation.
Figure 4:
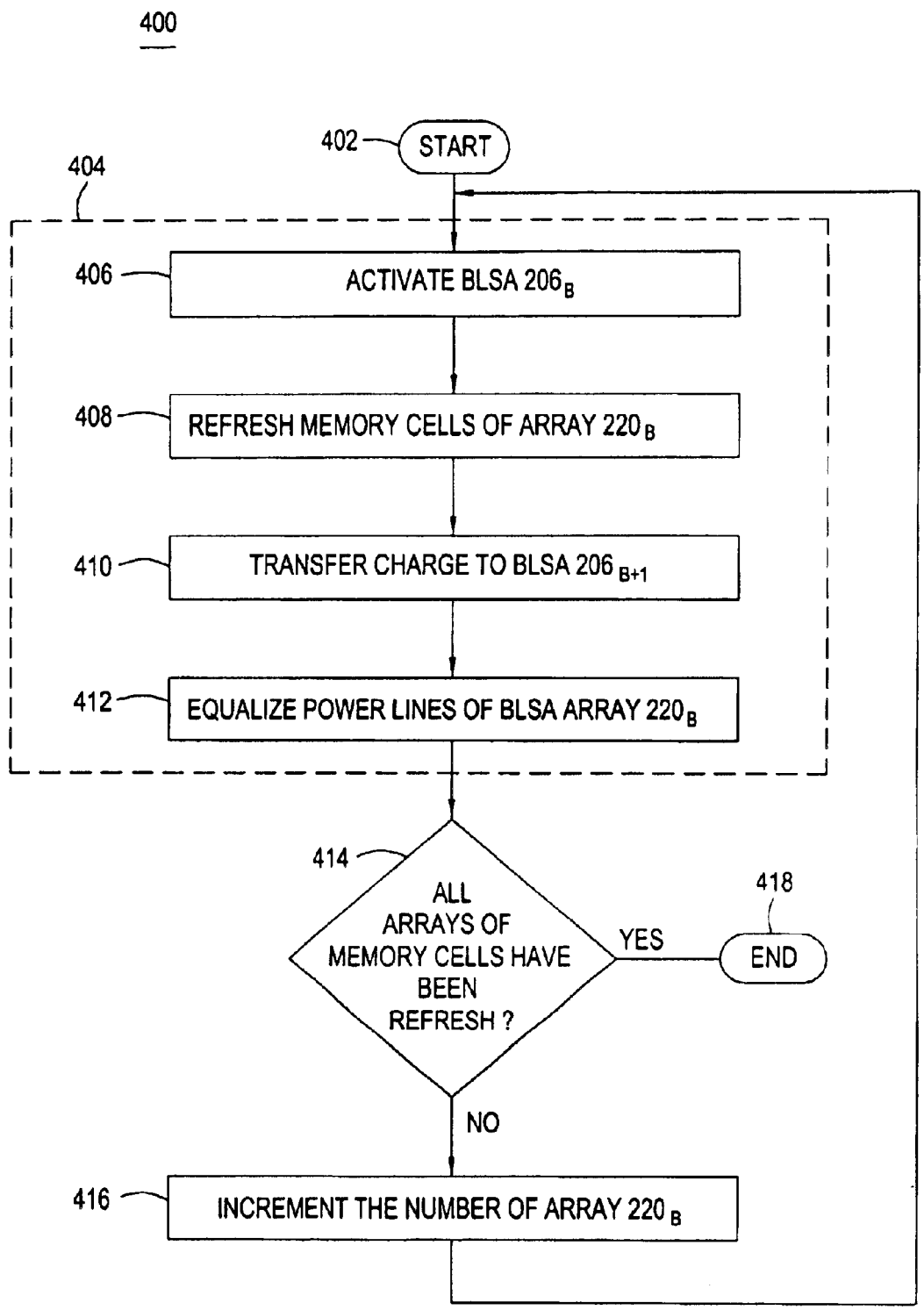
FIG. 4 depicts a flow diagram of exemplary operations for charge recycling using the circuit configuration of FIG. 2.
Figure 5:
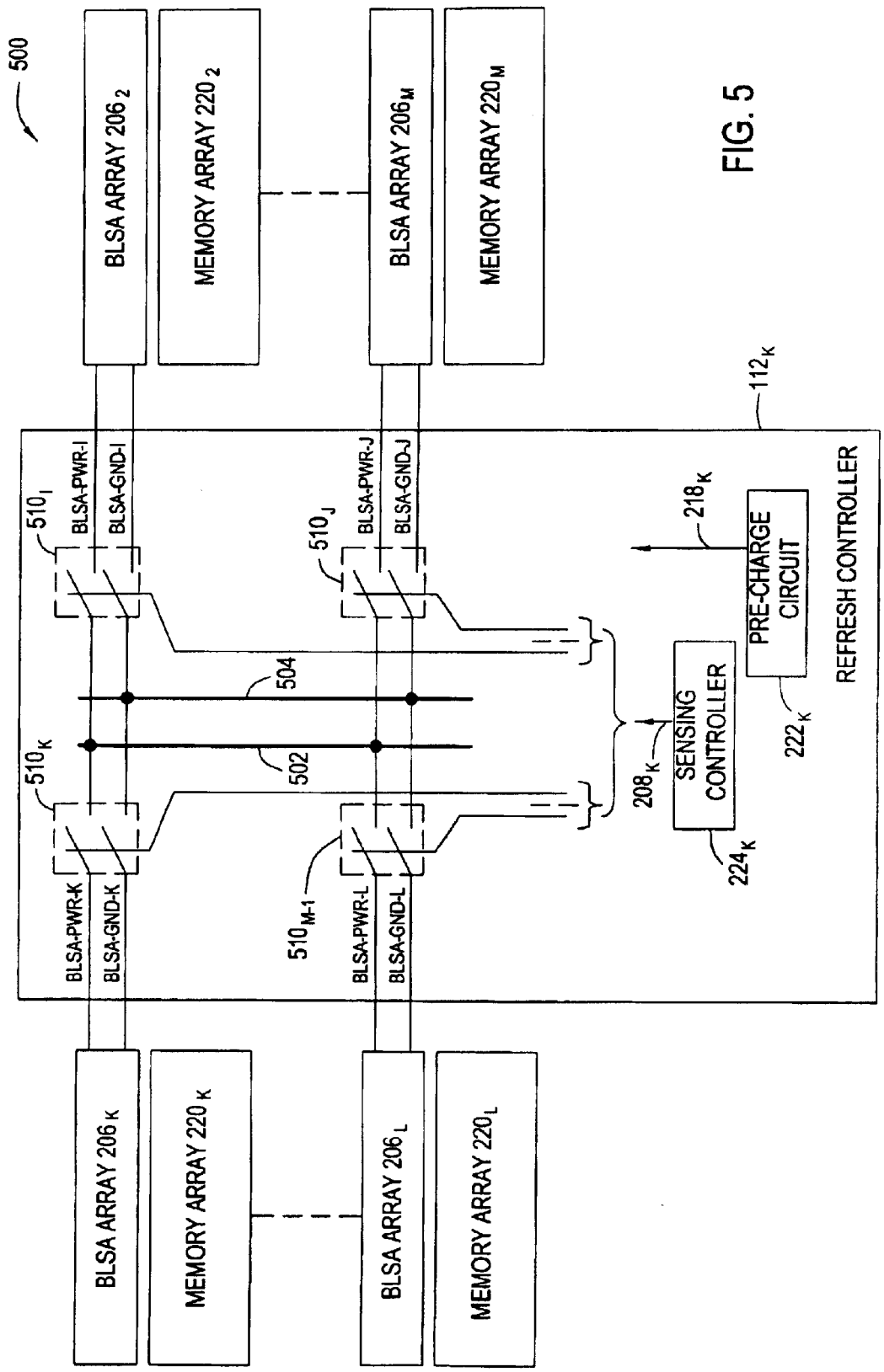
FIG. 5 depicts an exemplary circuit configuration for multiple charge recycling in accordance with one embodiment of the present invention.

FIG. 5 depicts an exemplary circuit configuration 500 that may be used for multiple charge recycling during a refresh operation in the DRAM device of FIG. 1 in accordance with one embodiment of the present invention. The circuit configuration 500 generally comprises a common recycling power line 502, a common recycling ground (GND) line 504, and a plurality of switches 510 for selective coupling BLSAs 206 to the common lines 502 and 504. Illustratively, only four BLSA arrays 206i, 206j, 206k, and 206l are shown.

Utilizing switches 510i–l (collectively, switches 510), the common power line 502 and common GND line 504 may be selectively coupled to the power nodes 214 and 216, respectively, in the BLSA arrays $206_{i-l}$ during refresh operations. In one embodiment, the switches 510 are selectively controlled by the sensing controller 224 using respective lines (labeled recycle__i–recycle__l) of the control bus 208. In operation, the switches 510 may couple, the BLSA arrays 206, in any combination thereof, to the lines 502 and 504. As such, the lines 502 and 504, together with the switches 510 facilitate a controlled power interface between the BLSA arrays of the memory device (e.g., component memory $104_K$ of the DRAM device 100 shown in FIG. 1). Of course, one skilled in the art will recognize that, rather than utilize a common recycle line, dedicated switches between corresponding array power lines may also be used to selectively couple the power lines.

Figure 6:
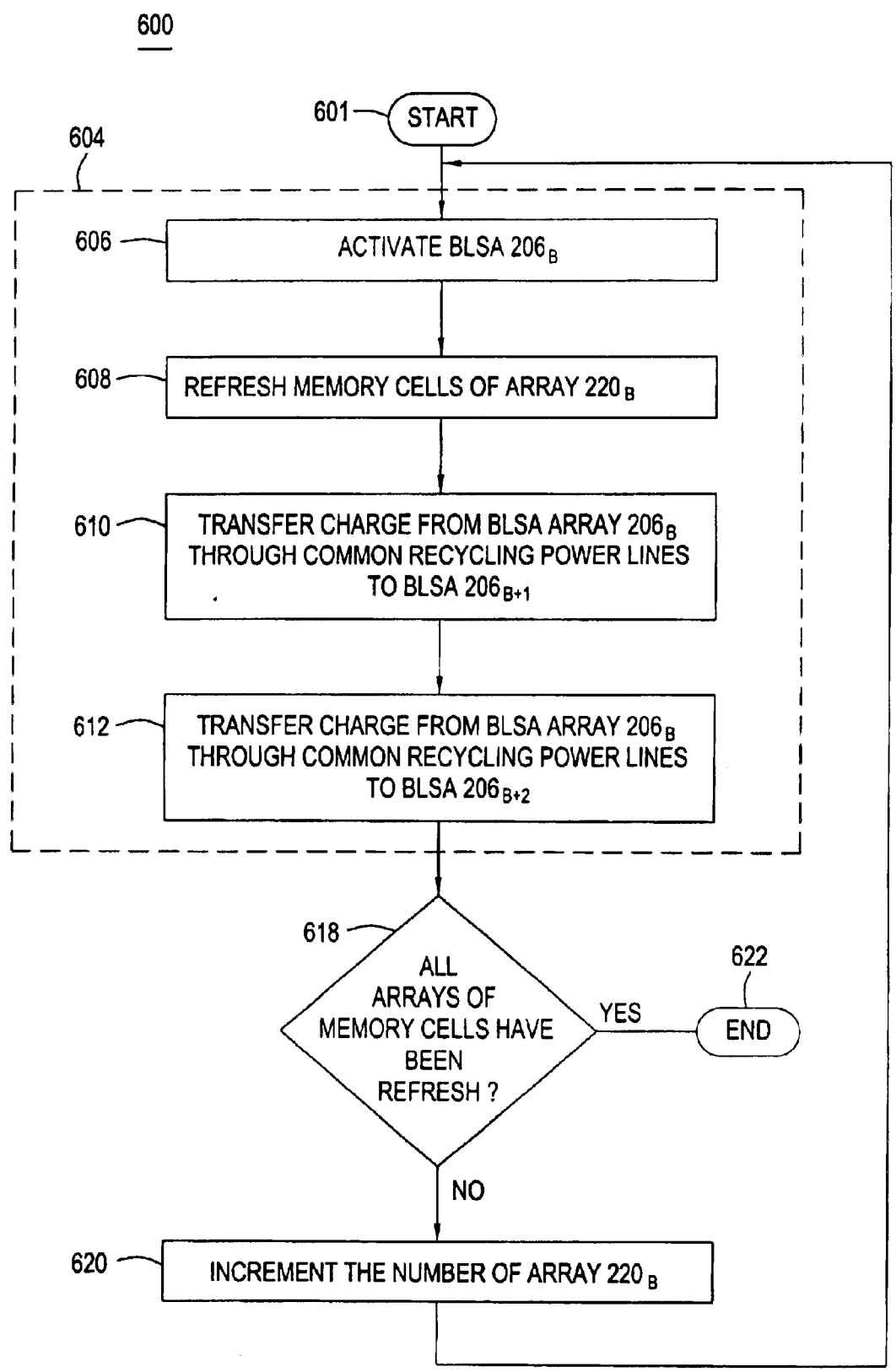
FIG. 6 depicts a flow diagram of exemplary operations for multiple charge recycling in accordance with one embodiment of the present invention.

Operation of the circuit configuration 500 may be best described with reference to FIG. 6, which is a flow diagram of exemplary operations 600 for multiple charge recycling (that may be performed by components of the circuit configuration 500). The operations 600 begin at step 602 and proceed to performing a refresh operation 604 (illustratively including steps 606–616). The operations 606–612 illustrate a refresh operation involving a first arbitrary BLSA array $206_B$ and assume a second BLSA array $206_{B-1}$ has been previously refreshed and that portions of charge from both are recycled to a third BLSA array $206_{B+1}$. Charge from BLSA array $206_{B-1}$ may also have been recycled to BLSA array $206_B$ during its refresh cycle.

At step 606, the refresh controller $112_K$ (shown in FIG. 1) activates a first BLSA array $206_B$, for example, in a conventional manner. At step 608, memory cells of the memory array $220_B$ coupled to the BLSA array $206_B$ are refreshed. Recall that, after sensing, power lines of the BLSA array $206_B$ are fully charged and this charge may be recycled by transferring the charge to other BLSA arrays. Further, as described above, another BLSA array $206_{-1}$ already used for recycling (e.g., by transferring charge to the BLSA array $206_B$), may still have charge remaining that may be again recycled (transferred) to another BLSA array $206_{B+1}$, in preparation of a refresh operations involving that array. Therefore, at step 610, a remaining portion of a charge is transferred from the BLSA array $206_{B-1}$ to the BLSA array $206_{B+1}$ through the common power line 502 and common GND line 504. At step 612, a portion of charge is also transferred from BLSA array $206_B$ to the BLSA array $206_{B+1}$.

As an example, assume that, charge is recycled from the BLSA array $206_i$ to the BLSA array $206_j$ during a previous refresh operation involving the BLSA array $206_j$. To further recycle (remaining) charge from the BLSA array $206_j$, the sensing controller 224 may momentarily close the switches $510_i$ and $510k$ (via a recycle__i and recycle__k control lines, respectively), to transfer charge from the BLSA array $206_i$ to the BLSA array $206_k$ during a subsequent refresh operation involving the BLSA array $206_k$. The switch $510_i$ may then be opened and (while the switch $510k$ is still closed) the switch $510_j$ may then be closed to transfer charge from the BLSA array $206_j$ to the BLSA array $206_k$. This example is further described below, with reference to FIG. 7.

Thus, multiple charge recycling results in an additional amount of charge being utilized, resulting in less charge required (from a power supply) to bring the power line of BLSA array $206_k$ to a full level. While not shown, during an additional step, the remaining charge of an even earlier BLSA array (e.g., $206_h$) may be transferred to the BLSA array $206_k$. However, as will be described in greater detail below, once the voltage level falls below a certain point (e.g., the threshold voltage of BLSA transistors), additional recycling may not be possible.

At step 618, the sequence 600 queries if all arrays 220 of the memory (e.g., component memory $104_K$) have been refreshed. If the query of step 618 is negatively answered, the sequence 600 proceeds to step 620. At step 620, the suffix of the BLSA array $206_B$ is incremented (i.e., from k to 1) and then the cycle 604 is the performed for the BLSA arrays with the increased suffix. Refresh cycles 604 may be repeated until all memory arrays of the memory device are refreshed. If the query of step 618 is affirmatively answered, the sequence 600 proceeds to step 622. At step 622, the sequence 600 ends.

An Exemplary Timing Diagram for Multiple Charge Recycling

Figure 7:
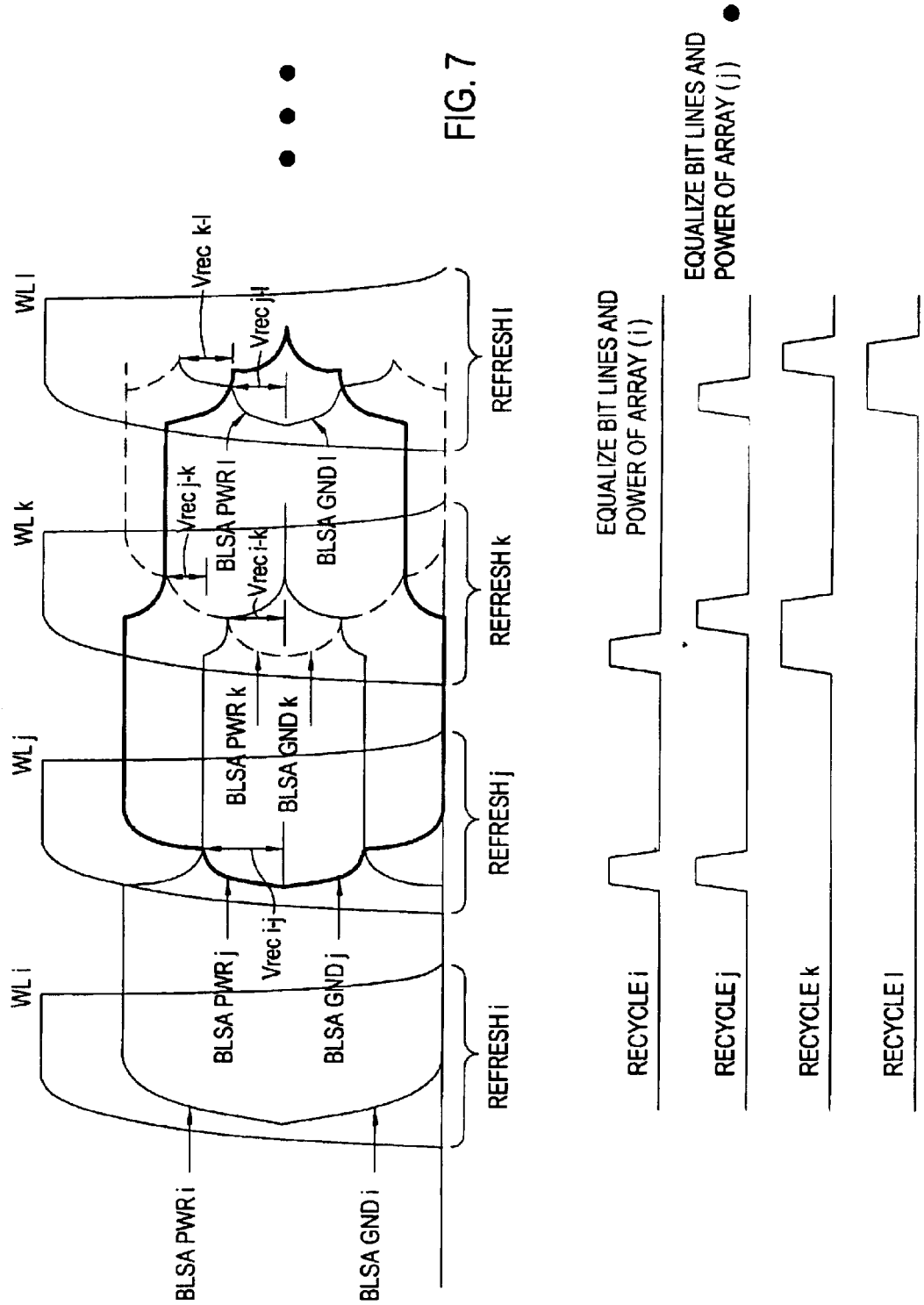
FIG. 7 illustrates an exemplary timing diagram illustrating multiple charge recycling in accordance with embodiments of the present invention.

FIG. 7 illustrates an exemplary timing diagram illustrating multiple recycling of charge from BLSA 206i that may further assist in understanding the recycling circuit configuration 500 of FIG. 5. For illustrative purposes, the timing diagram 700 assumes only double-charge recycling (e.g., charge from one array is recycled only twice). The top portion of the timing diagram illustrates the voltage levels of power and ground nodes (214 and 216) of the BLSA arrays 206i–l, as well as corresponding wordline voltage levels. The bottom portion of the timing diagram illustrates the recycle control signals recycle__i–recycle__l generated by the sensing controller 224. For purposes of illustration, it is assumed that no recycling takes place during a refresh operation involving the first BLSA arrays 206i.

As illustrated, prior to the refresh operation involving each BLSA array 206, the corresponding power and ground nodes (BLSA__PWR and BLSA__GND) are precharged. After the refresh operation involving the BLSA array 206i, the power node BLSA__PWR__i is at a full level and charge from the BLSA array 206i may be recycled to the BLSA array 206j. As shown, just prior to sensing during the refresh operation involving BLSA array 206j, switches 510i and 510j are closed by asserting the recycle__i and recycle__j control lines, coupling the power and ground nodes of the BLSA arrays 206i and 206j, which equalize to a level in between. In other words, charge is transferred (recycled) from BLSA__PWR__i to BLSA__PWR__j, resulting in an increase in the voltage level of BLSA__PWR__i from the precharge level by an amount labeled VRECi–j. The switches 510i and 510j are then opened and the remaining charge required for BLSA__PWR__J to reach the full voltage level is supplied by the power supply.

After the refresh operation involving the BLSA array 206j, the BLSA__PWR__j is at a full level. While BLSA__PWR__i has been reduced from the full level by VRECi–j, it still has approximately half the charge available for recycling. Therefore, prior to sensing during the refresh operation involving BLSA array 206k, switches 510i and 510k are closed by asserting the recycle__i and recycle__k control lines, coupling the power and ground nodes of the BLSA arrays 206i and 206k, which equalize to a level in between. As illustrated, charge is transferred from BLSA__

PWR_i to BLSA_PWR_k, resulting in an increase in the voltage level of BLSA_PWR_k from the precharge level by an amount labeled VRECi–k (approximately half of VRECi–j). The switches 510$i$ are then opened and switches 510$j$ are momentarily closed (while switches 510$k$ remain closed), recycling charge from BLSA_PWR_j to BLSA_PWR_k, resulting in an additional voltage level increase of VRECj–k.

Switches 510$j$ and 510$k$ are then opened and the remaining charge required for BLSA_PWR_k to reach the full voltage level is supplied by the power supply, which is a significantly lesser amount than was required from the power supply to bring BLSA_PWR_j to the full voltage level. As illustrated, similar operations are performed to recycle charge from BLSA_PWR_j and BLSA_PWR_k to BLSA_PWR_l.

As illustrated in FIG. 7, each time charge is recycled following bit line sensing, power lines (BLSA_PWR) of the source and receiving arrays are equalized, and the final value of the two power lines is approximately half of the initial values. Thus, the level of an increase due to recycling from a source power line gets smaller as charge recycling is repeated. This is further illustrated in FIG. 8, which illustrates the voltage increase contribution (above an initial precharge level) to a recipient array power line from multiple source arrays. In the illustrated sequence, charge from each power line is recycled three times (i.e., "3× recycling") prior to being precharged.

After sensing, power lines of the first array BLSA 206$1$ is at a full voltage level (100%). Therefore, the first recycling of charge from BLSA 206$1$ (to BLSA 206$2$) results in about a 50% increase of BLSA_PWR_2 above the precharge level and a corresponding reduction of BLSA_PWR_1. Therefore, the second recycling of charge from BLSA_PWR_1 results in only about a 25% increase of BLSA_PWR_3 above the precharge level, while the third results in only about a 12.5% increase of BLSA_PWR_4 above the precharge level.

Due to the initial recycling from BLSA_PWR_1, the charge recycling from BLSA_PWR_2 is done at different levels. The first recycling of charge from BLSA_PWR_2 to BLSA_PWR_3 is done between about 25% (the level of BLSA_PWR_3 after the second recycling from BLSA_PWR_1) and about 100%, resulting in a final level of about 62.5% above precharge level. Similarly, the second recycling of charge from BLSA_PWR_2 to BLSA_PWR_4 is done between about 12.5% (the level of BLSA_PWR_4 after the second recycling from BLSA_PWR_1) and about 62.5%, resulting in a final level of about 37.5% above precharge level, while the third recycling of charge from BLSA_PWR2 to BLSA_PWR_5 is done between 0% (assuming no more recycling from BLSA_PWR_1) and about 37.5%, resulting in a final level of about 18.75% above precharge level.

If the power line voltage level is too small, it may not be possible to perform charge recycling due to the threshold voltage limit of BLSA transistors (approx. 0.4–0.5V). In other words, if the power line voltage level fall below the threshold voltage limit, there may be no conductive path through the BLSA transistors from the bit lines to the power lines, which may impose a practical limitation on the number of times charge can be recycled from any given power line.

Figure 8:
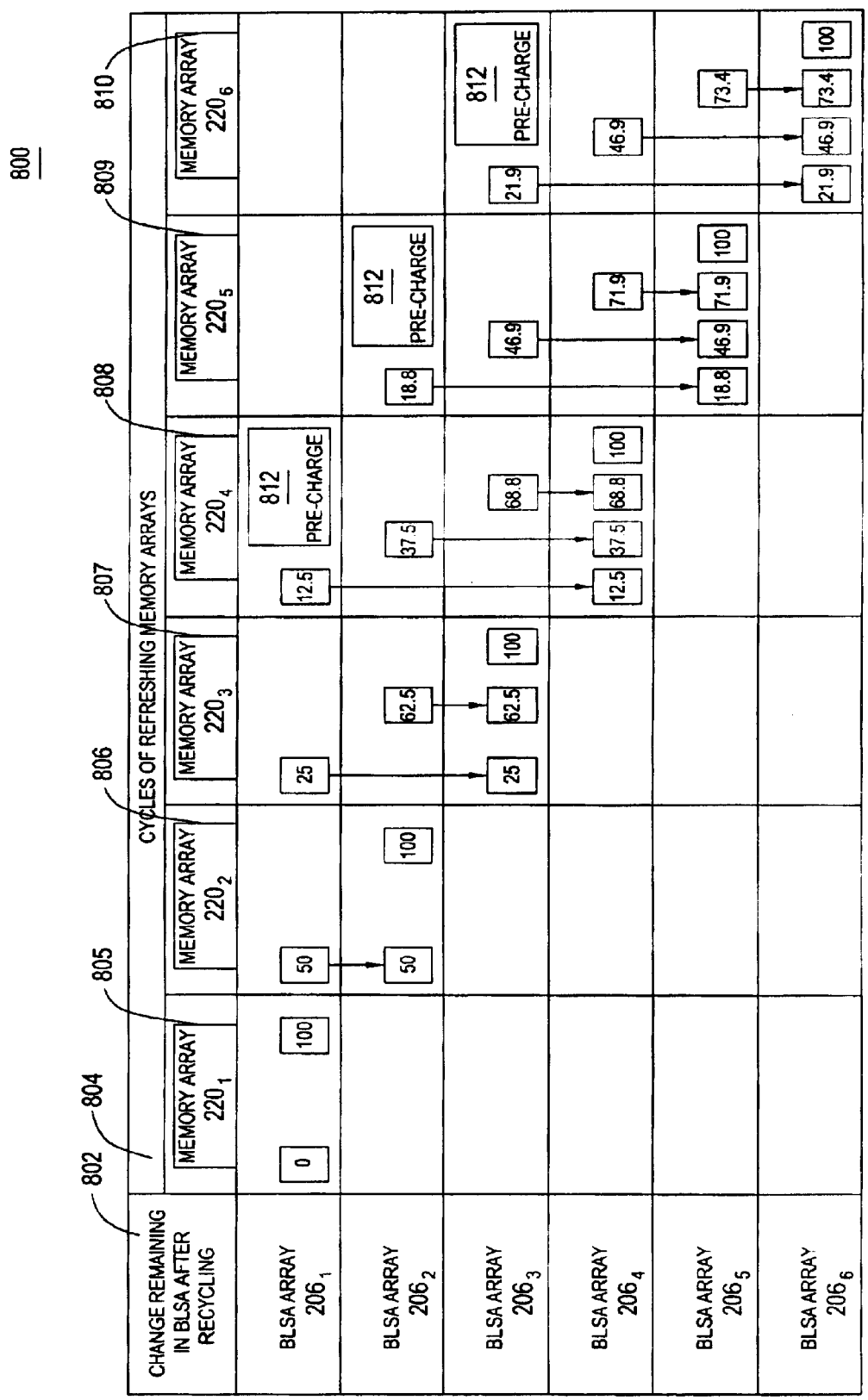
FIG. 8 depicts a table illustrating efficiency of multiple charge recycling in accordance with the timing diagram of FIG. 6.

As illustrated in FIG. 8, the minimum power level occurs at the third charge recycling of the first BLSA array 206$_1$, approximately 12.5%, which may not allow sufficient margin above the threshold limit, particularly considering process variations that may bring this value down and/or increase the transistor threshold level. Therefore, for some embodiments, it may be desirable to increase the minimum voltage level resulting on any power line used for recycling, in an effort to gain a sufficient margin above the threshold limit and ensure that recycling occurs.

Figure 9:
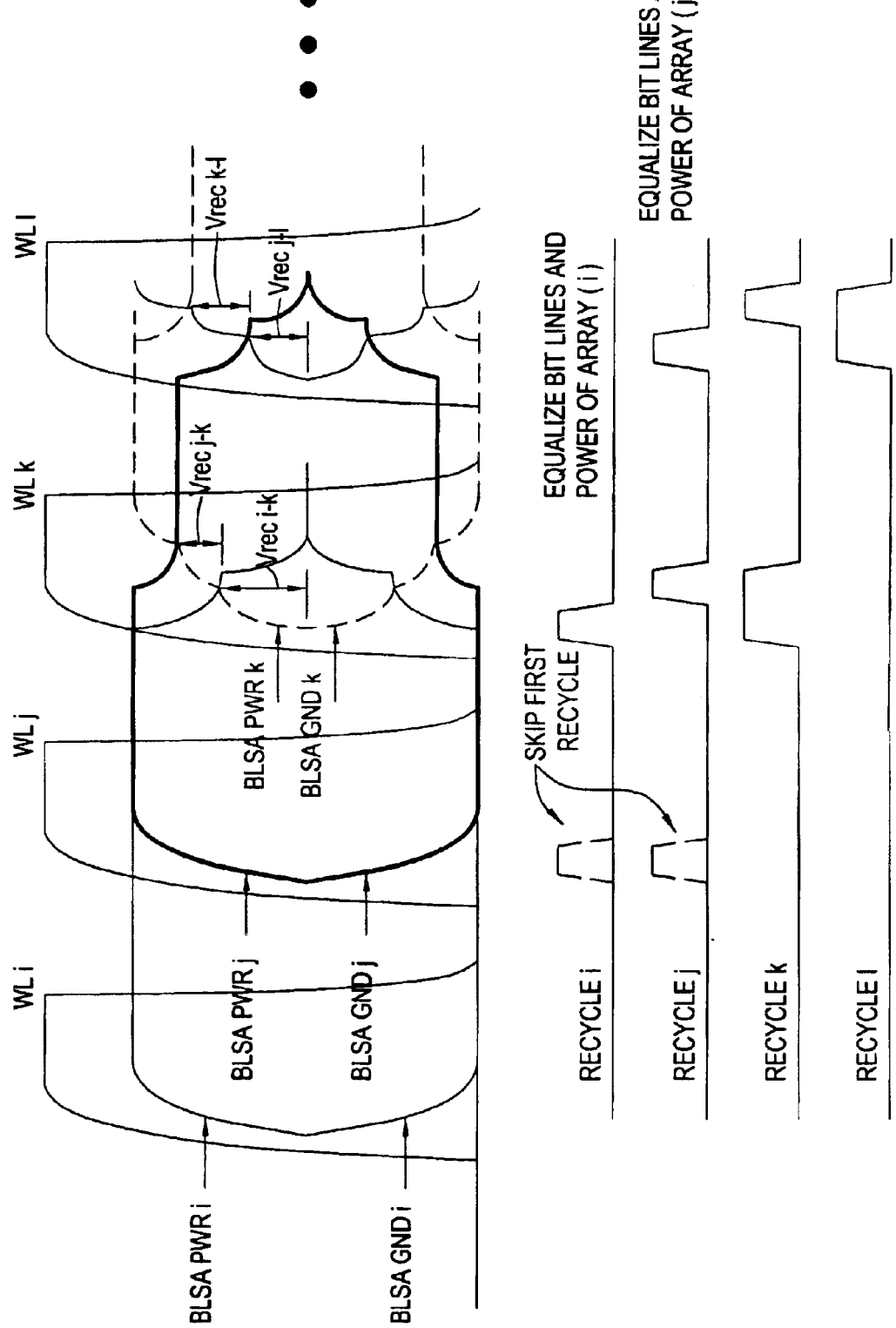
FIG. 9 illustrates another exemplary timing diagram illustrating multiple charge recycling in accordance with embodiments of the present invention.

One approach to increase this minimum voltage level is to not perform charge recycling for the first one or more BLSA arrays. This approach is illustrated in the timing diagram of FIG. 9 and the corresponding recycled charge sharing diagram of FIG. 10. As illustrated, the recycle sequence illustrated in FIG. 9 is similar that illustrated in FIG. 7, except the first charge recycling (from BLSA_PWR_i to BLSA_PWR_j) is skipped. As a result, after refreshing BLSA array 206$j$, both BLSA_PWR_i and BLSA_PWR_j are at a full voltage level. Therefore, the first recycling of charge from BLSA_PWR_i to BLSA_PWR_k may be done between 0% and 100% above precharge level, resulting in a final level (VPRECH+VRECi–k) of 50% above precharge level. Subsequently, the first recycling of charge from BLSA_PWR_j to BLSA_PWR_k may be done between 50% and 100% above precharge level, resulting in a final level (increased by VRECj–k) of 75% above precharge level.

Figure 10:
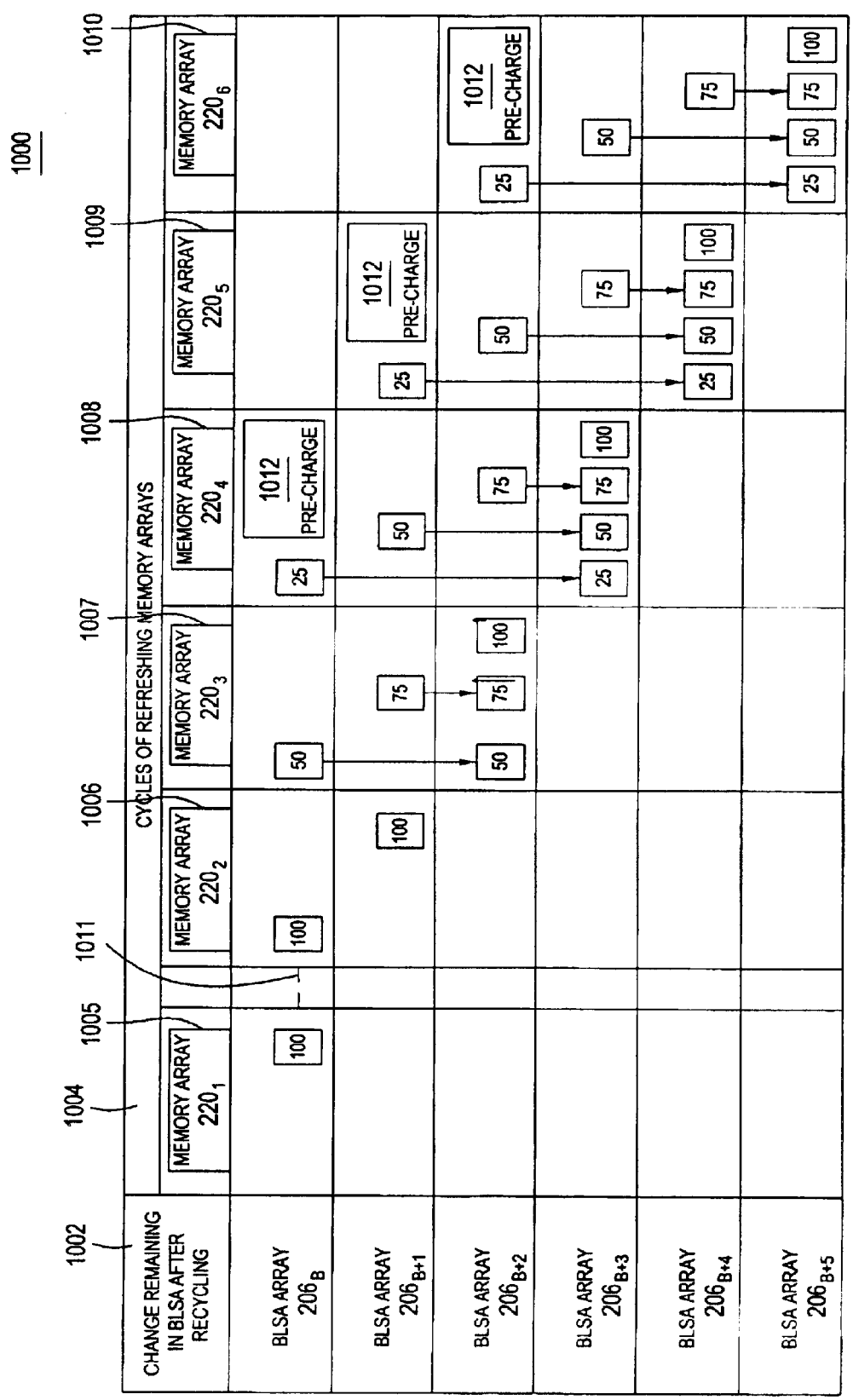
FIG. 10 depicts a table illustrating efficiency of multiple charge recycling in accordance with the timing diagram of FIG. 9.

As illustrated in FIG. 10, by skipping recycling for refresh operations of an initial one or more BLSA arrays, (following the first recycling of the first power line) the reduction in voltage levels seen on power lines used for recycling becomes uniform: about 75% (100%+50%/2) after the first recycling, about 50% (75%+25%/2) for second recycling, and about 25% (50%+0%) for the third recycling. More importantly, however, the minimum voltage level on any power line used for charge recycling is doubled (from about 12.5% to 25%), when compared to the sequence illustrated in FIGS. 7 and 8. Thus, the minimum voltage levels are at a much safer margin above the BLSA transistor threshold level, which should ensure charge recycling over the multiple cycles (and may allow charge to be recycled a larger number of times). Of course, those skilled in the art will realize that the exact voltage levels achieved after the different recycling for each power line will depend on the number of refresh operations for which recycling is initially skipped, as well as the total number of times charge Is recycled from each power line.

CONCLUSION

Through the use of multiple recycling techniques, embodiments of the present invention may provide more efficient use of bit line charges, resulting in greater reductions in power consumption when compared with conventional single recycling techniques. Bit line charges from arrays may be recycled any number of times before being precharged, generally limited only by the threshold voltage of bit line sense amplifier (BLSA) transistors.

While the foregoing is directed to embodiments of the present invention, other and further embodiments of the invention may be devised without departing from the basic scope thereof, and the scope thereof is determined by the claims that follow.

What is claimed is:

1. A method for recycling a charge in a memory device, comprising:
    performing a first refresh operation involving a first array of bit line sense amplifiers;
    transferring charge from power lines of the first array of bit line sense amplifiers to power lines of a second array of bit line sense amplifiers involved in a second refresh operation performed subsequent to the first refresh operation; and transferring charge from power lines of the first array of bit line sense amplifiers to power lines of a third array of bit line sense amplifiers involved in a third refresh operation performed subsequent to the second refresh operation.

2. The method of claim 1, further comprising transferring charge from power lines of the second array of bit line sense amplifiers to power lines of the third array of bit line sense amplifiers involved in the third refresh operation performed subsequent to the second refresh operation.

3. The method of claim 1, further comprising transferring charge from power lines of the first array of bit line sense amplifiers to power lines of at least a fourth array of bit line sense amplifiers involved in at least a fourth refresh operation performed subsequent to the third refresh operation.

4. The method of claim 3 further comprising transferring charge from power lines of the second and third arrays of bit line sense amplifiers to power lines of at least a fourth array of bit line sense amplifiers involved in at least a fourth refresh operation performed subsequent to the third refresh operation.

5. The method of claim 1, wherein transferring charge from power lines of the first array of bit line sense amplifiers to power lines of the second array of bit line sense amplifiers comprises:

closing one or more switches coupling the power lines of the first array of bit line sense amplifiers to one or more common recycle power lines; and closing one or more switches coupling the power lines of the second array of bit line sense amplifiers to the one or more common recycle power lines.

6. The method of claim 1, further comprising performing at least one intermediate refresh operation between the first and second refresh operations, wherein charge is not transferred from power lines of the first array of bit line sense amplifiers to power lines of an array of bit line sense amplifiers involved in the intermediate refresh operation.

7. The method of claim 6, wherein after the third refresh operation, the voltage difference between the power lines of the first array of bit line sense amplifiers and a precharge level is approximately 25% of the voltage difference between the precharge level and the voltage level of the power lines immediately after the first refresh operation.

8. A method of recycling charge for use in a refresh operation involving an ith array of bit line sense amplifiers of a memory device, where i is an integer, comprising:

precharging power lines of the $i^{th}$ array of bit line sense amplifiers;

sequentially transferring charge from one or more power lines of N arrays of bit line sense amplifiers involved in previous refresh operations to one or more power lines of the $i^{th}$ array, wherein N is an integer greater than 1 and the N arrays range from an $(i-N)^{th}$ array to an $(i-1)^{th}$ array; and subsequently coupling the one or more power lines of the ith array to one or more voltage supply lines.

9. The method of claim 8, wherein N is greater than 2.

10. The method of claim 8, wherein sequentially transferring charge from one or more power lines of the N arrays of bit line sense amplifiers to the one or more power lines of the $i^{th}$ array comprises:

closing a first one or more switches to couple the one or more power lines of the $i^{th}$ array to one or more common recycle lines; and while the first one or more switches are closed, sequentially closing a plurality of sets of one or more switches, wherein closing each set couples one or more power lines of a different one of the N arrays of bit line sense amplifiers to the one or more common recycle lines.

11. A method for recycling a charge in a dynamic random access memory (DRAM) device, comprising:

performing a first refresh operation involving a first array of bit line sense amplifiers;

momentarily closing one or more switches to couple one or more power lines of the first array of bit line sense amplifiers to power lines of a second array of bit line sense amplifiers involved in a second refresh operation performed subsequent to the first refresh operation; and momentarily closing one or more switches to couple one or more power lines of the first array of bit line sense amplifiers to power lines of a third array of bit line sense amplifiers involved in a third refresh operation performed subsequent to the second refresh operation.

12. A method for recycling charge comprising:

momentarily closing one or more switches to transfer charge from one or more power lines of a first array of bit line sense amplifiers involved in a first refresh operation to one or more power lines of at least second and third arrays of bit line sense amplifiers involved in subsequent refresh operations.

13. A circuit configuration for multiple recycling of bit line charges comprising:

one or more common recycle lines;

a plurality of switches, each to selectively couple one or more power lines of a plurality of bit line sense amplifier arrays to the one or more common recycle lines; and a controller configured to generate a plurality of recycle control signals to control the plurality of switches to sequentially (i) transfer charge from one or more power lines of a first array of bit line sense amplifiers previously involved in a first refresh operation to one or more power lines of a second array of bit line sense amplifiers involved in a second refresh operation performed subsequent to the first refresh operation and (ii) transfer charge from power lines of the first array of bit line sense amplifiers to power lines of a third array of bit line sense amplifiers involved in a third refresh operation performed subsequent to the second refresh operation.

14. The circuit configuration of claim 13, wherein the controller is configured to transfer charge from the one or more power lines of the first array of bit line sense amplifiers to the one or more power lines of the second array of bit line sense amplifiers by:

asserting a first recycle control signal to close a first one or more switches coupling the one or more power lines of the first array of bit line sense amplifiers to the one or more common recycle lines; and while the first one or more switches is closed, assert a second recycle control signal to momentarily close a second one or more switches coupling the one or more power lines of the second array of bit line sense amplifiers to the one or more common recycle lines.

15. The circuit configuration of claim 14, wherein the controller is configured to transfer charge from the one or more power lines of the first array of bit line sense amplifiers to the one or more power lines of the third array of bit line sense amplifiers and transfer charge from the one or more power lines of the second array of bit line sense amplifiers to the one or more power lines of the third array of bit line sense amplifiers by:

asserting the first recycle control signal to close a first one or more switches coupling the one or more power lines of the first array of bit line sense amplifiers to the one or more common recycle lines;

while the first one or more switches is closed, asserting a third recycle control signal to close a third one or more switches coupling the one or more power lines of the third array of bit line sense amplifiers to the one or more common recycle lines;

de-assert the first recycle control signal to open the first one or more switches; and while the third one or more switches is closed, asserting the second recycle control signal to momentarily close a second one or more switches coupling the one or more power lines of the second array of bit line sense amplifiers to the one or more common recycle lines.

16. The circuit configuration of claim 14, wherein the controller is further configured to transfer charge from one or more power lines of the first array of bit line sense amplifiers to one or more power lines of at least a fourth array of bit line sense amplifiers involved in at least a fourth refresh operation performed subsequent to the third refresh operation.

17. A memory device comprising:

a plurality of memory cell arrays, each having at least one corresponding array bit line sense amplifiers;

coupling means for selectively coupling one or more power lines of the arrays of bit line sense amplifiers; and recycle control circuitry configured to, via the coupling means, (i) transfer charge from power lines of a first array of bit line sense amplifiers previously involved in a first refresh operation to power lines of a second array of bit line sense amplifiers involved in a second refresh operation performed subsequent to the first refresh operation and (ii) transfer charge from power lines of the first array of bit line sense amplifiers to power lines of at least a third array of bit line sense amplifiers involved in at least a third refresh operation performed subsequent to the second refresh operation.

18. The memory device of claim 17, wherein the means for selectively coupling one or more power lines of the arrays of bit line sense amplifiers comprises:

one or more common recycle lines; and a plurality of sets of one or more switches, each set to couple a corresponding one or more power lines of an associated array of bit line sense amplifiers to the one or more common recycle lines.

19. The memory device of claim 17, wherein the recycle control circuitry is configured to transfer charge from the one or more power lines of the first array of bit line sense amplifiers to the one or more power lines of the second array of bit line sense amplifiers by momentarily closing a first set of one or more switches coupling the one or more power lines of the first array of bit line sense amplifiers to the one or more common recycle lines and while the first set of one or more switches is closed, momentarily closing a second one or more switches coupling the one or more power lines of the second array of bit line sense amplifiers to the one or more common recycle lines.

20. The memory device of claim 17, wherein the recycle control circuitry is further configured to, via the coupling means, transfer charge from power lines of the first array of bit line sense amplifiers to power lines of at least a fourth array of bit line sense amplifiers involved in at least a fourth refresh operation performed subsequent to the third refresh operation.

21. The memory device of claim 17, wherein the recycle control circuitry is further configured to, via the coupling means, transfer charge from power lines of the second and third arrays of bit line sense amplifiers to power lines of at least a fourth array of bit line sense amplifiers involved in at least a fourth refresh operation performed subsequent to the third refresh operation.

22. The memory device of claim 17, wherein at least one intermediate refresh operation is performed between the first and second refresh operations, wherein the recycle control circuitry is configured to not transfer charge from power lines of the first array of bit line sense amplifiers to power lines of an array of bit line sense amplifiers involved in the intermediate refresh operation.

23. The memory device of claim 22, wherein after the third refresh operation, the voltage difference between the power lines of the first array of bit line sense amplifiers and a precharge level is approximately 25% of the voltage difference between the precharge level and the voltage level of the power lines immediately after the first refresh operation.

* * * * *